United States Patent
Okabe et al.

(10) Patent No.: US 7,636,993 B2
(45) Date of Patent: Dec. 29, 2009

(54) METHOD FOR PRODUCING A PIEZOELECTRIC FILM ACTUATOR

(75) Inventors: Takehito Okabe, Atsugi (JP); Nobuhiko Sato, Sagamihara (JP); Makoto Kurotobi, Yokohama (JP); Kenichi Takeda, Yokohama (JP); Toshihiro Ifuku, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 447 days.

(21) Appl. No.: 11/218,515

(22) Filed: Sep. 6, 2005

(65) Prior Publication Data
US 2006/0049723 A1 Mar. 9, 2006

(30) Foreign Application Priority Data
Sep. 6, 2004 (JP) .............................. 2004-258366

(51) Int. Cl.
H01L 41/22 (2006.01)
H01L 41/00 (2006.01)

(52) U.S. Cl. .................. 29/25.35; 29/830; 29/831; 29/832; 29/846; 310/311

(58) Field of Classification Search ............... 29/25.35, 29/830, 831, 832, 846; 216/27, 47, 37; 347/47, 347/72, 68–70, 71; 310/311, 348, 313 A, 310/328, 327
See application file for complete search history.

(56) References Cited

U.S. PATENT DOCUMENTS

| | | | |
|---|---|---|---|
| 5,242,863 A * | 9/1993 | Xiang-Zheng et al. ........ 438/53 |
| 5,534,903 A * | 7/1996 | Hayakawa et al. ............ 347/71 |
| 5,652,436 A * | 7/1997 | Stoner et al. .................. 257/77 |
| 6,183,070 B1 * | 2/2001 | Hashizume .................. 347/70 |
| 6,347,862 B1 | 2/2002 | Kanno et al. .................. 347/68 |
| 6,382,292 B1 | 5/2002 | Ohmi et al. .................. 156/584 |
| 6,561,634 B1 * | 5/2003 | Nishikawa .................. 347/71 |
| 6,779,878 B2 * | 8/2004 | Higuchi et al. ................. 347/70 |
| 6,911,107 B2 | 6/2005 | Kagawa et al. .............. 156/230 |
| 7,053,526 B2 | 5/2006 | Unno et al. .................. 310/324 |
| 2003/0017712 A1 * | 1/2003 | Brendel ....................... 438/758 |

FOREIGN PATENT DOCUMENTS

| | | | |
|---|---|---|---|
| JP | 10-286953 | | 10/1998 |
| JP | 2877800 | | 1/1999 |
| JP | 2976479 | | 9/1999 |
| JP | 2003-309303 | * | 4/2002 |
| JP | 2002-134806 | | 5/2002 |
| JP | 2002-234156 | | 8/2002 |
| JP | 2003-309303 | * | 10/2003 |

* cited by examiner

*Primary Examiner*—Derris H Banks
*Assistant Examiner*—Tai Nguyen
(74) *Attorney, Agent, or Firm*—Fitzpatrick, Cella, Harper & Scinto

(57) ABSTRACT

A method for producing a piezoelectric film actuator is provided. This method includes the steps of preparing an intermediate transfer member having a porous layer formed thereon, with a vibrating plate and a piezoelectric layer being provided on the porous layer; bonding the vibrating plate to a nozzle substrate to form a composite structure; and separating the intermediate transfer member from the composite structure at the porous layer to transfer the vibrating plate and the piezoelectric layer to the nozzle substrate.

8 Claims, 5 Drawing Sheets

METHOD FOR PRODUCING A PIEZOELECTRIC FILM ACTUATOR

BACKGROUND OF THE INVENTION

1. Field of the Invention

The present invention relates to methods for producing piezoelectric film actuators for use in, for example, liquid-ejecting heads.

2. Description of the Related Art

Known liquid-ejecting heads are disclosed in, for example, the following publications.

(1) Japanese Patent Laid-Open No. 2002-134806

According to this publication, a vibrating plate composite and piezoelectric films are provided to cavity parts by forming the piezoelectric films on an intermediate transfer member, bonding the vibrating plate composite to the piezoelectric films, and separating the intermediate transfer member to transfer the piezoelectric films to the vibrating plate composite.

(2) Japanese Patent Laid-Open No. 2002-234156

This publication discloses a piezoelectric element composite including a single-crystal or polycrystalline vibrating plate sandwiched between oxide layers and uniaxial-crystal or single-crystal piezoelectric films.

A liquid-ejecting head is provided by sequentially forming a $SiO_2$ film, a YSZ film, Pt films, and PZT films, which function as piezoelectric films, on an SOI substrate, partially etching the Si substrate to form pressure chambers, and bonding an intermediate Si substrate and an orifice plate that constitute parts of the pressure chambers.

(3) Japanese Patent No. 2976479

This publication discloses a liquid-ejecting head including a nozzle substrate having nozzles, a silicon substrate having cavities communicating with the nozzles and thin film parts corresponding to the cavities, and pressure generators formed on the thin film parts integrally without any bonding step.

(4) Japanese Patent Laid-Open No. 10-286953

According to this publication, electrodes, lead-based dielectric layers, electrodes, and a vibrating plate are sequentially formed on a MgO substrate. After resin or glass for forming pressure chambers are provided on the vibrating plate, the MgO substrate is partially or completely removed. The pressure chambers are formed by, for example, patterning.

First Problem: According to Japanese Patent Laid-Open No. 2002-134806, after the piezoelectric films are transferred to the vibrating plate composite, a wiring step is required to provide, for example, electrical paths to the piezoelectric films. This step involves limitations such as the need for avoiding the breakage of ink cavities. Such limitations make it difficult to support flexibility in, for example, finer processing and heat processes.

Second Problem: The liquid-ejecting head according to Japanese Patent Laid-Open No. 2002-234156 has the following two problems.

(1) Use of an SOI Wafer leads to high production cost because the wafer is more expensive than general silicon wafers.

(2) If the selective etching of the Si wafer for forming pressure chambers is performed by alkali etching to ensure etching selectivity to the buried silicon oxide, the openings of the pressure chambers become larger than the areas thereof adjacent to the vibrating plate. This is disadvantageous in arranging the pressure chambers at higher density.

Third Problem: Japanese Patent No. 2976479 is disadvantageous in terms of the thickness control of the vibrating plate. As the amount of each droplet ejected is reduced to improve the resolution and gradation of ink jet printers, the number of ink dots per unit area on printing paper is increased. Accordingly, the responsiveness of the vibrating plate must be enhanced to maintain printing speed by, for example, reducing the thickness of the vibrating plate. The reduction in the thickness of the silicon vibrating plate, however, may cause a problem in thickness control because selective etching based on the difference in impurity concentration has low selectivity.

Fourth Problem: According to Japanese Patent Laid-Open No. 10-286953, the use of the MgO substrate makes it difficult to form peripheral circuitry, such as a drive circuit, using single-crystal silicon as an active layer. This is disadvantageous in terms of the finer processing of ink jet heads, which is accompanied by higher density. Because ink jet heads with higher densities require higher-speed drive circuits, it is desired to form peripheral circuitry on single-crystal silicon, which is a high-mobility material. If a Si substrate is used, however, the vibrating plate cannot be made of Si. This causes difficulty in achieving a high-quality single-crystal vibrating plate with good sensitivity.

SUMMARY OF THE INVENTION

In light of the above problems, the present invention provides a piezoelectric film actuator that includes a vibrating plate with finely controlled thickness, may be produced without the use of an SOI wafer, and is insusceptible to heat processes, and also provides a method for producing the piezoelectric film actuator.

A method for producing a piezoelectric film actuator according to the present invention includes the steps of preparing a first substrate having a porous layer formed thereon, with a vibrating plate and a piezoelectric layer being provided on the porous layer; bonding the vibrating plate to a second substrate to form a composite structure; and separating the first substrate from the composite structure at the porous layer to transfer the vibrating plate and the piezoelectric layer to the second substrate.

In yet another aspect, the present invention relates to a composite structure including a first substrate on which a porous layer is disposed; a piezoelectric layer; a vibrating plate disposed between the porous layer and the piezoelectric layer; and a second substrate to which the vibrating plate is bonded, wherein the porous layer is disposed between the first substrate and the vibrating plate.

Further features of the present invention will become apparent from the following description of exemplary embodiments with reference to the attached drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Figure 1A:
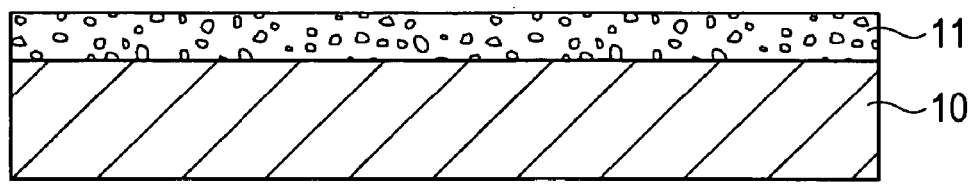
FIGS. 1A to 1C are diagrams showing the main steps of a method for producing a piezoelectric film actuator according to the present invention.
Figure 1B:
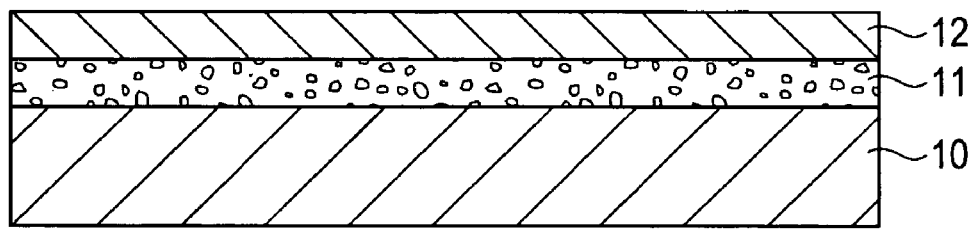
Figure 1C:
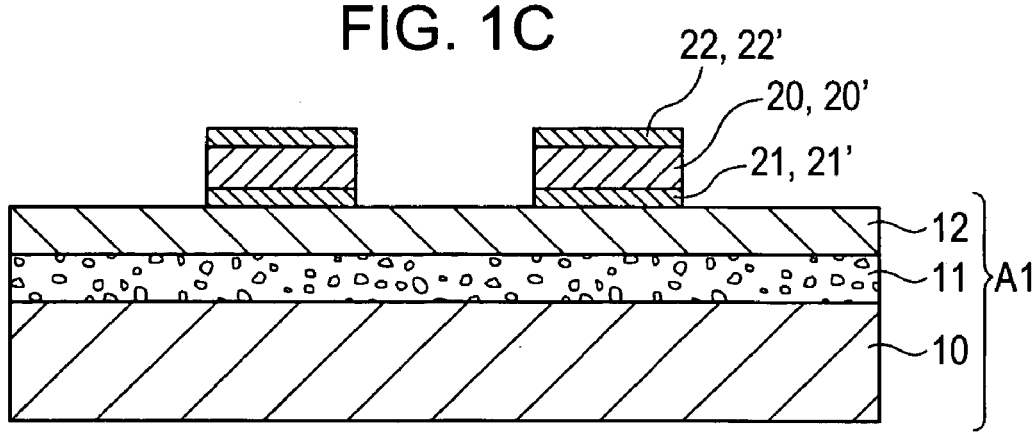

Embodiments of the present invention will now be described in detail with reference to the drawings. FIGS. 1A to 1C are diagrams showing the main steps of a method for producing a piezoelectric film actuator (hereinafter also simply referred to as an actuator) according to the present invention. As shown in FIGS. 1A to 1C, the method for producing a piezoelectric film actuator according to the present invention includes the main steps of forming a porous silicon layer on a first substrate made of silicon (hereinafter also referred to as an intermediate transfer member); forming a vibrating plate on the porous layer; and forming a piezoelectric layer on the vibrating plate. This method further includes the steps of bonding the vibrating plate to a second substrate to form a composite structure; and separating the intermediate transfer member from the composite structure at the porous layer to transfer the vibrating plate and the piezoelectric layer to the second substrate. The individual steps according to the present invention will be specifically described below.

1. Formation of Vibrating Plate, Piezoelectric Film, and Electrode (1) Formation of Porous Silicon Layer (FIG. 1A)

Referring to FIG. 1A, a porous Si layer 11 is formed on one of the main surfaces, which are polished, of a single-crystal Si substrate 10 having a thickness of 625 μm. The porous layer 11 is intended to facilitate the removal of the intermediate transfer member after the vibrating plate and the piezoelectric film are bonded to cavities. The porous layer 11 is formed by, for example, anodizing, in which current is applied with the main surface of the single-crystal Si substrate 10 as an anode in an aqueous HF solution.

The thickness of the porous layer 11 is defined by, for example, controlling the time for anodizing. The porous layer 11 may have a bilayer structure including an exposed first layer with lower porosity and an underlying second layer with higher porosity than the first layer. The bilayer structure allows stress to concentrate at the part of the second layer in the vicinity of the interface between the first and second layers so that they can be separated selectively at that part.

The thickness of the porous layer 11 is not particularly limited. The porous layer 11 may have a thickness of 0.01 to 200 μm, particularly 0.5 to 10 μm; excessive thickness causes large wafer warpage which may interfere with the process. If the porous layer 11 has the bilayer structure, the first layer generally has a thickness of 20 μm or less, particularly 10 μm or less, and the second layer generally has a thickness of 10 μm or less, particularly 5 μm or less. The porosity of the first layer is generally 60% or less, particularly 30% or less; high porosity degrades the quality (e.g., crystal defect density and surface roughness) of an epitaxial layer.

The porosity may be determined according to the change in wafer weight before and after the anodizing and the thickness of the porous layer 11.

(2) Formation of Vibrating Plate (FIG. 1B)

After the anodizing, a vibrating plate 12 is formed on the porous layer 11. The vibrating plate 12 may be made of Si, though the material used is not limited to Si. The vibrating plate 12 may be formed by, for example, thermal CVD, plasma-enhanced CVD, MBE, or liquid-phase epitaxy.

The vibrating plate 12 is made of a material with a Young's modulus of 50 GPa or more. Examples of such a material include stainless steel, Ti, zirconia, Si, Cu, $SiO_2$, glass, and Cr. The vibrating plate 12 may have either a monolayer structure or a multilayer structure. For the multilayer structure, the total Young's modulus must be 50 GPa or more. The vibrating plate 12 may have a thickness of 0.5 to 20 μm, particularly 1 to 10 μm. The material for the vibrating plate 12 may be doped with a slight amount of metal such as Y or B.

In particular, Si may be used for the vibrating plate 12 since a drive circuit, for example, can be formed in a normal Si process.

(3) Formation of Pressure Generator (FIG. 1C)

A piezoelectric layer made of PZT and accompanying electrode layers are formed on the vibrating plate 12, which is a nonporous single-crystal film, by, for example, the following process.

A common electrode layer 21, a piezoelectric layer 20, and an individual electrode layer 22 are formed on the vibrating plate 12 by sputtering or ion plating. The common electrode layer 21 is made of, for example, Pt, Cr, or Ni and has a thickness of 1 μm. The piezoelectric layer 20 is made of PZT and has a thickness of 10 μm. The individual electrode layer 22 is made of, for example, Pt, Cr, or Ni. A patterned resist film is formed on the individual electrode layer 22. The common electrode layer 21, the individual electrode layer 22, and the piezoelectric layer 20 are etched using the resist film as a mask by ion etching or reactive ion etching to form common electrodes 21', individual electrodes 22', and piezoelectric layers 20'. Additionally, vibrating parts and wiring parts are formed at the same time.

2. Formation of Nozzle and Production of Ink Jet Head (4) Formation of Nozzle Substrate (FIGS. 2A to 2C)

Next, a process for preparing a nozzle substrate A2 and its structure will be described with reference to FIGS. 2A to 2C. The nozzle substrate A2 may be made of any material that can form nozzles. Examples of the material for the nozzle substrate A2 include glass, resin, and single-crystal Si. In particular, a single-crystal Si substrate may be used because it has the same thermal expansion coefficient as the piezoelectric substrate A1 and good resistance to aging. Nozzles are formed by, for example, the following process.

Figure 2A:
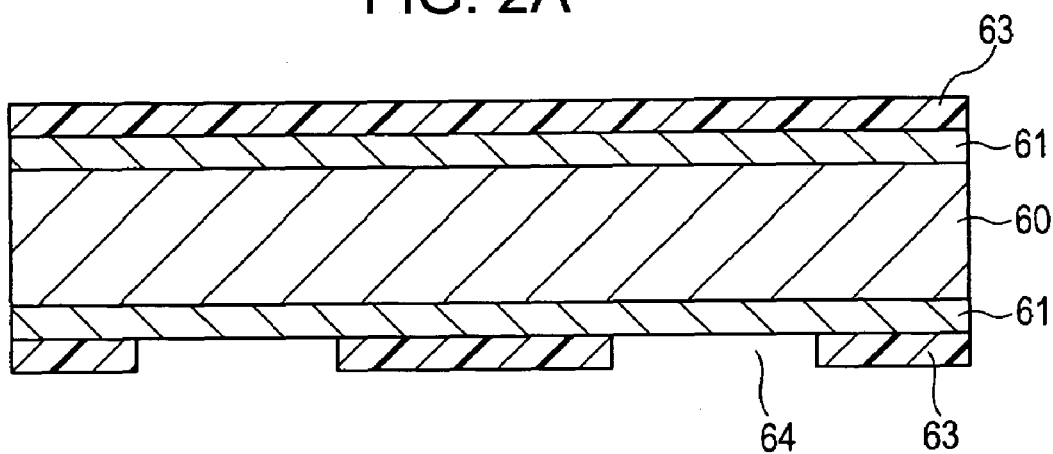
FIGS. 2A to 2C are diagrams showing the steps of preparing a nozzle substrate according to the present invention.
Figure 2B:
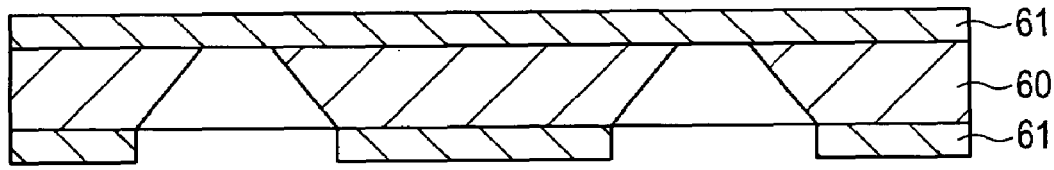
Figure 2C:
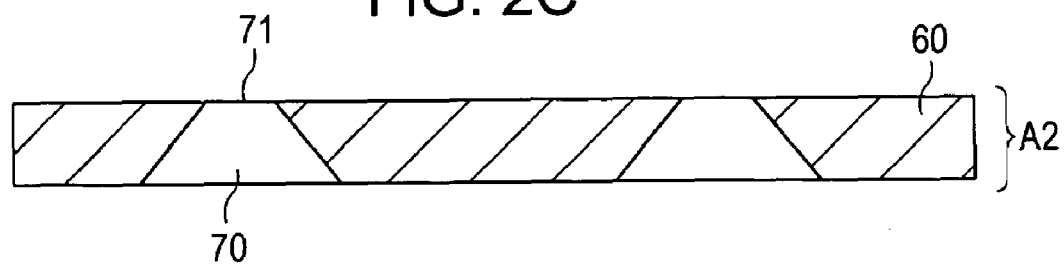

Referring to FIGS. 2A to 2C, a single-crystal Si substrate 60 with both surfaces thereof polished that has a thickness of 100 μm is prepared. $SiO_2$ films 61 having a thickness of 0.1 μm are formed on both surfaces of the single-crystal Si substrate 60 by thermal oxidation. A resist layer 63 is formed on the surface of one $SiO_2$ film 61 other than square regions 64 having the same dimensions as the openings of cavities to be formed on the nozzle substrate A2 such that the square regions 64 have sides in the [110] directions, while another resist layer 63 is formed on the overall surface of the other $SiO_2$ film 61 (FIG. 2A).

The portions of the $SiO_2$ film 61 in the square regions 64 are removed by etching, and then the resist layers 63 are removed. Subsequently, the single-crystal Si substrate 60 is anisotropically etched with an aqueous solution of pyrocatechol and ethylenediamine (FIG. 2B), and the $SiO_2$ films 61 are removed. The resultant nozzles 70 have outlets 71 smaller than the cavity openings (FIG. 2C).

The nozzle substrate A2 may also be formed by laminating two substrates made of different materials or the same material. In this case, a cavity portion and a nozzle portion can be separately formed. Examples of the material used include glass, resin, and single-crystal Si. In particular, a single-crystal Si substrate may be used because it has the same thermal expansion coefficient as the piezoelectric substrate A1 and good resistance to aging.

Figure 3A:
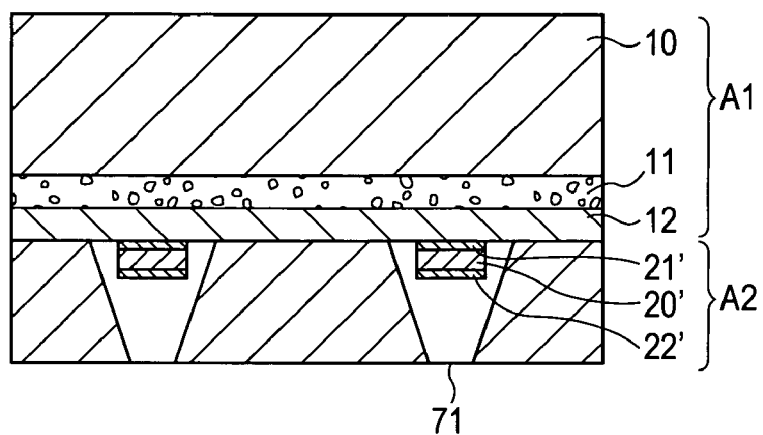
FIGS. 3A to 3D are diagrams showing the steps of producing a piezoelectric film actuator with a piezoelectric substrate and the nozzle substrate according to the present invention.

(5) Bonding of Piezoelectric Substrate and Nozzle Substrate (FIG. 3A)

The piezoelectric substrate A1 and the nozzle substrate A2 thus produced are bonded to form a composite structure such that the piezoelectric layers 20' and the nozzle outlets 71 are directed to the ejection side. These substrates A1 and A2 may be bonded by, for example, anodic bonding, active metal brazing, or the use of adhesive or covalent bonding.

Even an adhesive with low heat resistance may be used since the drive circuit, for example, has already been formed.

Figure 3B:
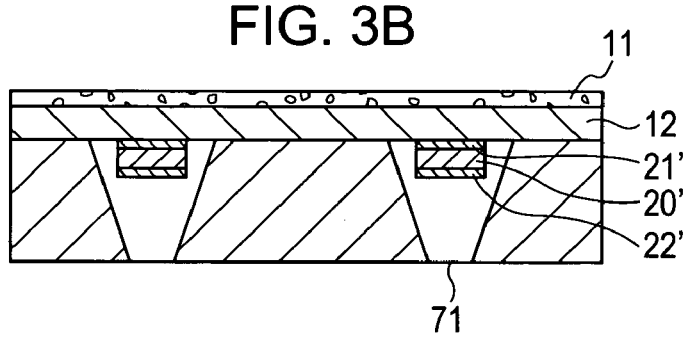

(6) Separation of Intermediate Transfer Member from Vibrating Plate and Piezoelectric Element (FIG. 3B)

Referring to FIG. 3B, the intermediate transfer member (single-crystal Si substrate) 10 is separated from the composite structure, which is an actuator including the vibrating plate 12 and the piezoelectric layers 20' bonded thereto, at the porous layer 11 to transfer the vibrating plate 12 and the piezoelectric layers 20' to the nozzle substrate A2. The intermediate transfer member 10 may be separated by, for example, destroying the porous layer 11 mechanically or with water jets, or by rapid heating through laser irradiation.

Japanese Patent No. 2877800, to the assignee of the present application, discloses a method for separating a composite member, such as bonded substrates, with a fluid.

Figure 3C:
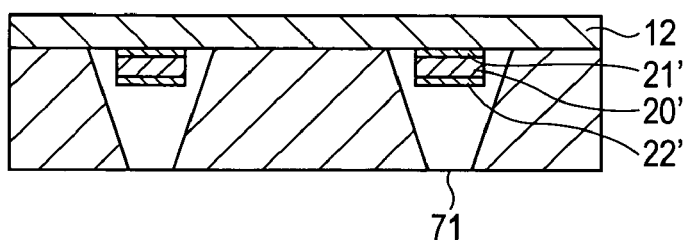

(7) Removal of Porous Layer (FIG. 3C)

If the porous layer 11 is not exposed after the separation of the intermediate transfer member 10, the porous layer 11 is exposed by, for example, lapping, grinding, polishing, or etching. This exposure step is not required if the porous layer 11 has already been exposed.

Subsequently, the porous layer 11 is etched with, for example, a hydrofluoric acid solution. The etchant used may be a hydrofluoric acid solution particularly if the porous layer 11 is oxidized in advance. The etchant used, however, is not limited to a hydrofluoric acid solution; an aqueous alkali solution, for example, may be used if no oxide is formed on the pore walls of the porous layer 11 or if oxide is removed in advance.

Figure 3D:
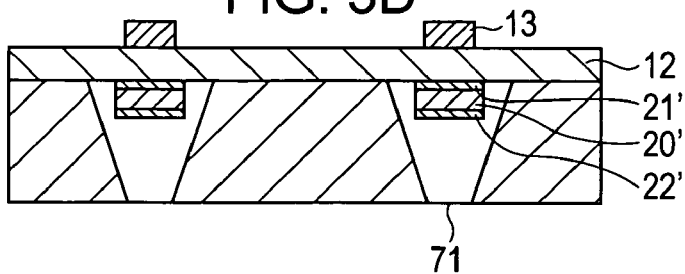

(8) Formation of Penetrating Electrode (FIG. 3D)

After the removal of the porous layer 11, if necessary, electrical paths to the pressure generators are provided from above since the pressure generators are disposed in the nozzle substrate A2. Penetrating electrodes 13 may be readily provided if the vibrating plate 12 is made of a thin film having a thickness of about 0.2 μm.

The penetrating electrodes 13 may be formed by any method with a metal such as Ni, Sn, W, Fe, Cu, Au, or Pt.

EXAMPLE

Next, the present invention will be described with reference to an example below, though the invention is not limited to the example.

FIGS. 3A to 3D, 4A and 4B, and 5A and 5B are schematic diagrams showing the steps of a method for producing a liquid-ejecting head including a piezoelectric film actuator according to a specific example of the present invention.

(1) Formation of Porous Silicon

In the step of forming a porous layer on an intermediate transfer member, a Si crystal substrate having a thickness of 625 μm was used as the intermediate transfer member. A porous Si layer was provided by forming an exposed first layer under the conditions of a current density of 8 mA/cm$^2$ and a processing time of 5 to 11 minutes and then forming an underlying second layer under the conditions of a current density of 23 to 33 mA/cm$^2$ and a processing time of 80 seconds to 2 minutes in a mixed solution of an aqueous HF solution (HF concentration: 49% by weight) and ethanol in a ratio of 2:1 by volume. The first layer had a porosity of about 20% and a thickness of about 6 μm while the second layer had a porosity of about 50% and a thickness of about 3 μm.

(2) Formation of Vibrating Plate

A single-crystal Si layer was allowed to grow on the porous Si layer as a vibrating plate by CVD. In the initial growth stage, a non-porous film was allowed to grow at a low rate by supplying a slight amount, namely 20 nm/min or less, of starting material to seal pores on the surface of the porous Si layer before a single-crystal Si layer having a thickness of 10 μm was formed at a growth rate of 1 μm/min.

(3) Formation of Pressure Generator

Figure 4A:
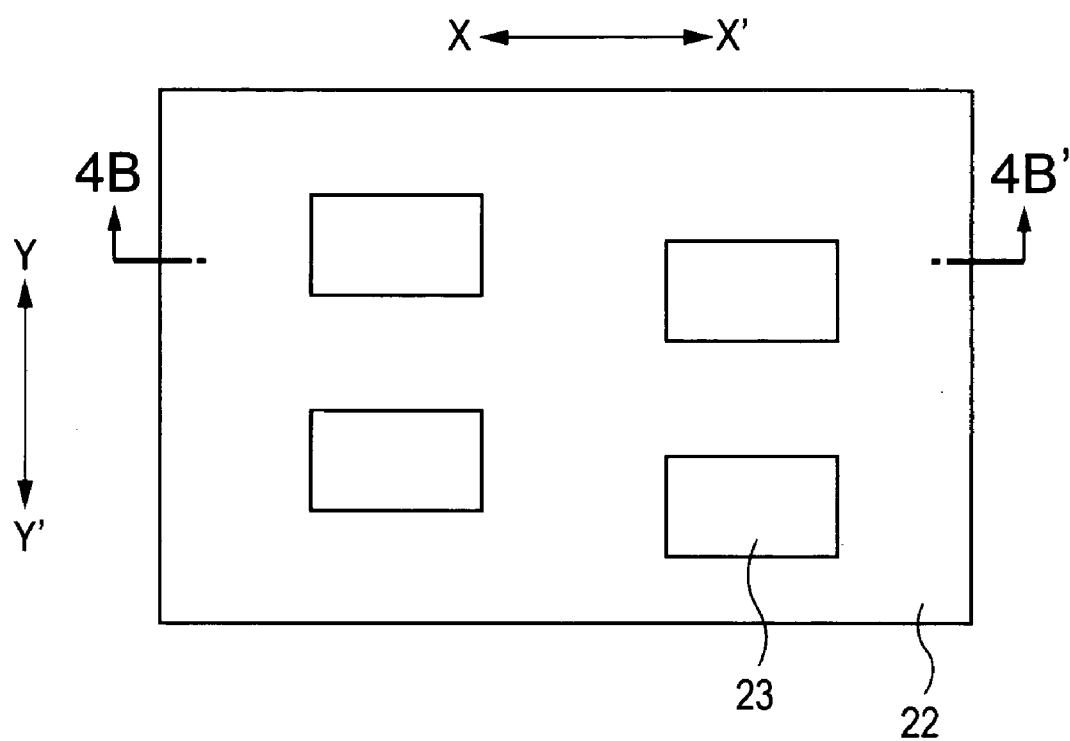
FIGS. 4A and 4B are diagrams of a piezoelectric substrate according to an example of the present invention after the formation of resist films.
Figure 4B:
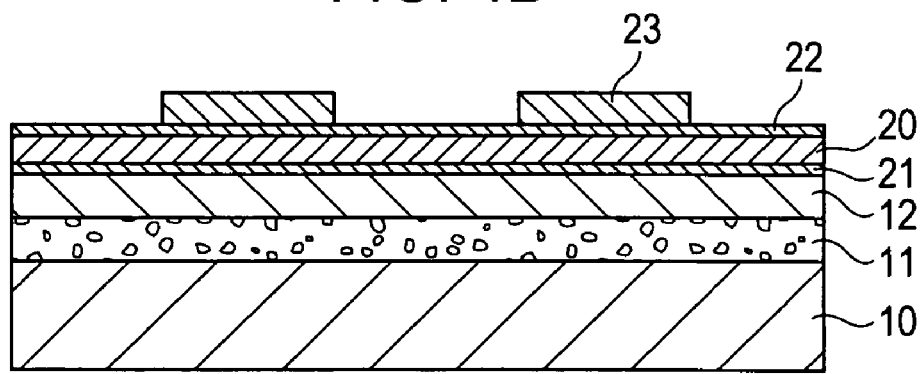

FIGS. 4A and 4B are diagrams of the piezoelectric substrate A1 after the formation of resist films. FIG. 4A is a top view of the piezoelectric substrate A1, and FIG. 4B is a sectional view taken along line 4B-4B' in FIG. 4A. A common electrode layer 21, a piezoelectric layer 20, and an individual electrode layer 22 were formed on the vibrating plate 12 by sputtering or ion plating. The common electrode layer 21 was made of, for example, Pt, Cr, or Ni and had a thickness of 1 μm. The piezoelectric layer 20 was made of PZT and had a thickness of 10 μm. The individual electrode layer 22 was made of, for example, Pt, Cr, or Ni. Resist films 23 were formed on the individual electrode layer 22. These resist films 23 had dimensions of 425 μm by 800 μm, and the sides thereof were aligned in the directions indicated by arrows X-X' and Y-Y' in the drawing.

Figure 5A:
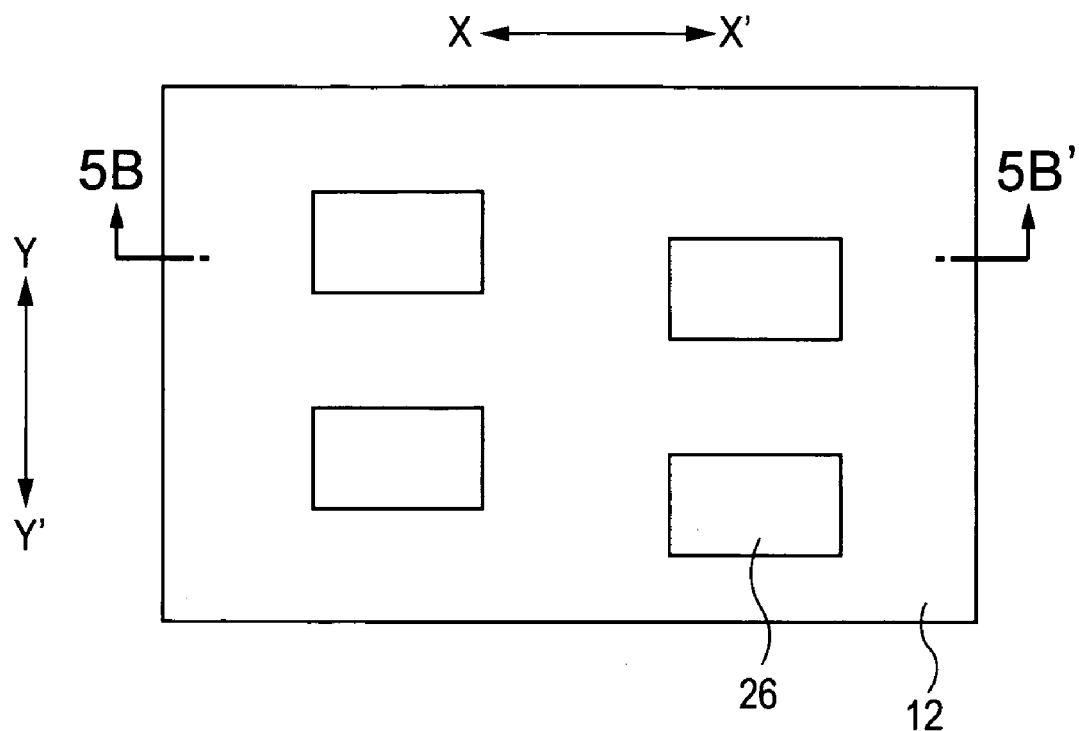
FIGS. 5A and 5B are diagrams of the piezoelectric substrate in the step following the step in FIGS. 4A and 4B.
Figure 5B:
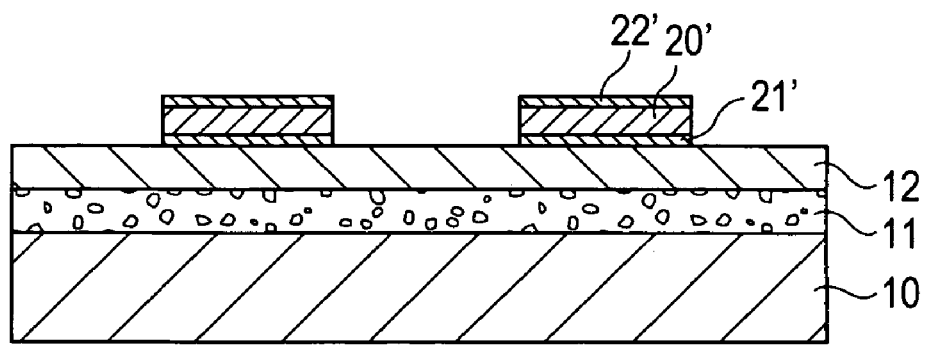

FIGS. 5A and 5B are diagrams of the piezoelectric substrate A1 in the subsequent step. FIG. 5A is a top view of the piezoelectric substrate A1, and FIG. 5B is a sectional view taken along line 5B-5B' in FIG. 5A. The common electrode layer 21, the individual electrode layer 22, and the piezoelectric layer 20, shown in FIGS. 4A and 4B, were etched by ion etching or reactive ion etching using the pattern of the resist films 23 to form common electrodes 21', individual electrodes 22', and piezoelectric layers 20' (pressure generators 26).

(4) Formation of Nozzle Substrate

Referring to FIGS. 2A to 2C, a single-crystal Si substrate 60 with both surfaces thereof polished that had a thickness of 100 μm was prepared. SiO$_2$ films 61 having a thickness of 0.1 μm were formed on both surfaces of the single-crystal Si substrate 60 by thermal oxidation. A resist layer 63 was formed on the surface of one SiO$_2$ film 61 other than square regions 64 having the same dimensions as the openings of cavities to be formed on the nozzle substrate A2 such that the square regions 64 had sides in the [110] directions, while another resist layer 63 was formed on the overall surface of the other SiO$_2$ film 61 (FIG. 2A). The portions of the SiO$_2$ film 61 in the square regions 64 were removed by etching, and then the resist layers 63 were removed. Subsequently, the single-crystal Si substrate 60 was anisotropically etched with an aqueous solution of pyrocatechol and ethylenediamine (FIG. 2B), and the SiO$_2$ films 61 were removed. The resultant nozzles 70 had outlets 71 smaller than the cavity openings (FIG. 2C).

(5) Bonding

In the subsequent step of bonding the vibrating plate and the pressure generators disposed on the intermediate transfer member to the nozzle substrate, the piezoelectric substrate A1 and the nozzle substrate A2 were brought into contact such that the piezoelectric layers 20' and the nozzle outlets 71 were directed to the ejection side. These substrates A1 and A2 were subjected to anodic bonding at 400° C. by applying a voltage of 1,000 V across the piezoelectric substrate A1, at a minus potential, and the nozzle substrate A2, at a plus potential.

(6) Separation

The intermediate transfer member could be readily separated at the porous layer by exposing the porous layer to a water jet with a pressure of $15 \times 10^4$ kPa.

(7) Formation of Electrode

After etching, a $SiO_2$ mask was formed on the vibrating plate, which was etched to a depth of 10 µm from the wafer surface by dry etching to form openings having dimensions of 10 µm by 10 µm directly over the pressure generators. These openings were filled with Cu by plating, and the Cu was mechanically polished to form flat surfaces. The $SiO_2$ films were removed to provide electrodes.

The liquid-ejecting head thus produced could stably eject liquid at a rate of 11 m/s with a drive voltage of 20 V and a frequency of 15 kHz.

According to the present invention, a vibrating plate may be deposited on an intermediate transfer member to facilitate the control of thickness of the vibrating plate and provide more uniform thickness. This has the advantage that the thickness of the vibrating plate can be freely adjusted according to the performance of pressure generators. In addition, normal semiconductor equipment may be used.

The steps of forming the vibrating plate and the pressure generators may be separated from the steps of forming a nozzle substrate having cavities. This has the advantage that the material for the vibrating plate, as an actuator, may be widely selected, and the material for the nozzle substrate may be freely selected.

In addition, the present invention avoids limitations associated with handling and heat processes in a wiring step for forming, for example, a drive circuit because the wiring step is finished before the bonding of the nozzle substrate.

Furthermore, the intermediate transfer member may be readily separated at a porous layer mechanically or by laser irradiation without damaging the vibrating plate. This allows the recycling of the intermediate transfer member.

Accordingly, the present invention can provide a piezoelectric film actuator capable of producing large displacement at a low drive voltage, responding quickly, producing large power, and achieving higher area and density. In addition, the present invention can provide a long, high-density liquid-ejecting head capable of producing large displacement at a low drive voltage and providing quick response and high reliability.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2004-258366 filed Sep. 6, 2004, which is hereby incorporated by reference herein in its entirety.

What is claimed is:

1. A method for producing a piezoelectric film actuator, comprising the steps of:

preparing a first substrate having a porous layer formed thereon, with a vibrating plate and a piezoelectric layer being provided on the porous layer;

bonding the vibrating plate to a second substrate to form a composite structure; and separating the first substrate from the composite structure at the porous layer to transfer the vibrating plate and the piezoelectric layer to the second substrate, wherein the porous layer is formed by anodizing a substrate comprising the first substrate.

2. A method for producing a piezoelectric film actuator, comprising the steps of:

preparing a first substrate having a porous layer formed thereon, with a vibrating plate and a piezoelectric layer being provided on the porous layer;

bonding the vibrating plate to a second substrate to form a composite structure; and separating the first substrate from the composite structure at the porous layer to transfer the vibrating plate and the piezoelectric layer to the second substrate, wherein the porous layer comprises silicon.

3. The method for producing a piezoelectric film actuator, comprising the steps of:

preparing a first substrate having a porous layer formed thereon, with a vibrating plate and a piezoelectric layer being provided on the porous layer;

bonding the vibrating plate to a second substrate to form a composite structure; and separating the first substrate from the composite structure at the porous layer to transfer the vibrating plate and the piezoelectric layer to the second substrate, wherein the vibrating plate is formed on the porous layer by an epitaxial growth method.

4. A method for producing a piezoelectric film actuator, comprising the steps of:

preparing a first substrate having a porous layer formed thereon, with a vibrating plate and a piezoelectric layer being provided on the porous layer;

bonding the vibrating plate to a second substrate to form a composite structure; and separating the first substrate from the composite structure at the porous layer to transfer the vibrating plate and the piezoelectric layer to the second substrate, wherein the vibrating plate comprises silicon.

5. A method for producing a piezoelectric film actuator, comprising the steps of:

preparing a first substrate having a porous layer formed thereon, with a vibrating plate and a piezoelectric layer being provided on the porous layer;

bonding the vibrating plate to a second substrate to form a composite structure; and separating the first substrate from the composite structure at the porous layer to transfer the vibrating plate and the piezoelectric layer to the second substrate, wherein the second substrate has a nozzle.

6. The method for producing a piezoelectric film actuator according to claim 5, wherein after the bonding step, the piezoelectric layer is disposed in the nozzle.

7. The method for producing a piezoelectric film actuator according to claim 6, wherein after the separating step, an electrical path to the piezoelectric layer is formed through the vibrating plate.

8. A method for producing a piezoelectric film actuator, comprising the steps of:

preparing a first substrate having a porous layer formed thereon, with a vibrating plate and a piezoelectric layer being provided on the porous layer;

bonding the vibrating plate to a second substrate to form a composite structure; and separating the first substrate from the composite structure at the porous layer to transfer the vibrating plate and the piezoelectric layer to the second substrate, wherein the porous layer comprises first and second layers with different thicknesses.

* * * * *